US006637210B2

(12) United States Patent
Bell

(10) Patent No.: US 6,637,210 B2
(45) Date of Patent: Oct. 28, 2003

(54) THERMOELECTRIC TRANSIENT COOLING AND HEATING SYSTEMS

(75) Inventor: Lon E. Bell, Altadena, CA (US)

(73) Assignee: BSST LLC, Irwindale, CA (US)

( * ) Notice: Subject to any disclaimer, the term of this patent is extended or adjusted under 35 U.S.C. 154(b) by 0 days.

(21) Appl. No.: 10/074,543

(22) Filed: Feb. 11, 2002

(65) Prior Publication Data

US 2002/0108381 A1 Aug. 15, 2002

Related U.S. Application Data

(60) Provisional application No. 60/267,657, filed on Feb. 9, 2001.

(51) Int. Cl.[7] ............................. F25B 21/02; H01L 35/28
(52) U.S. Cl. ............................... 62/3.7; 62/3.3; 136/208
(58) Field of Search ...................... 62/3.7, 3.3; 136/204, 136/203, 208, 209, 210

(56) References Cited

U.S. PATENT DOCUMENTS

| | | | |
|---|---|---|---|
| 3,635,037 A | 1/1972 | Hubert | |
| 3,681,929 A | 8/1972 | Schering | |
| 3,779,814 A | 12/1973 | Miles et al. | |
| 4,065,936 A | 1/1978 | Fenton et al. | |
| 4,730,459 A | 3/1988 | Schlicklin et al. | |
| 5,092,129 A | 3/1992 | Bayes et al. | |
| 5,228,923 A | 7/1993 | Hed | |
| 5,232,516 A | 8/1993 | Hed | |
| 5,584,183 A | 12/1996 | Wright et al. | |
| 5,682,748 A | * 11/1997 | DeVilbiss et al. | ............ 62/3.7 |
| 5,966,941 A | 10/1999 | Ghoshal | |
| 6,084,172 A | 7/2000 | Kishi et al. | |
| 6,334,311 B1 | 1/2002 | Kim et al. | |
| 6,346,668 B1 | 2/2002 | McGrew | |
| 6,347,521 B1 | 2/2002 | Kadotani et al. | |

OTHER PUBLICATIONS

A New Concept for Improving Thermoelectric Heat Pump Efficiency, R.J. Buist, J.W. Fenton and J.S. Lee, Borg–Warner Thermoelectrics Wolf and Algonquin Road.
A New Concept of Porous Thermoelectric Module Using a Reciprocating Flow for Cooling/Heating System (Numerical Analysis for Heating System), Shigeru Tada, Ryozo Echigo and Hideo Yoshida, 16th International Conference on Thermoelectrics (1997).
International Search Report for PCT/US 02/03654 dated Jun. 12, 2002.
H.J. Goldsmid, *Electronic Refrigeration*, Pion Ltd, 207 Brondesbury Park, London (1986).
Stanley W. Angrist, *Direct Energy Conversion*, 32 Ed. Ally & Bacon (1976).
International Search Report for PCT/US 02/06285 dated Jun. 12, 2002.
Buist, R. and Lau, P., Theoretical Analysis of Thermoelectric Cooling Performance Enchancement Via thermal and Electrical Pulsing, journal of Thermoelectricity, No. 4, 1996.
Miner, A., Majumdar, A., and U. Ghosal, Thermo–Electromechanical Refrigeration Based On Transient Thermoelectric Effects, Applied Physics Letters, vol. 75, pp. 1176–1178 (1999).

\* cited by examiner

*Primary Examiner*—Chen-Wen Jiang
(74) *Attorney, Agent, or Firm*—Knobbe, Martens, Olson & Bear LLP

(57) ABSTRACT

An improved efficiency thermoelectric system operates the thermoelectric elements in the system in a non-steady state manner. The thermoelectric elements are powered for predefined periods of time to obtain increased efficiency. This benefit can be improved by also altering the resistance of the thermoelectric elements during the power-on period such that resistive heating is minimized.

38 Claims, 13 Drawing Sheets

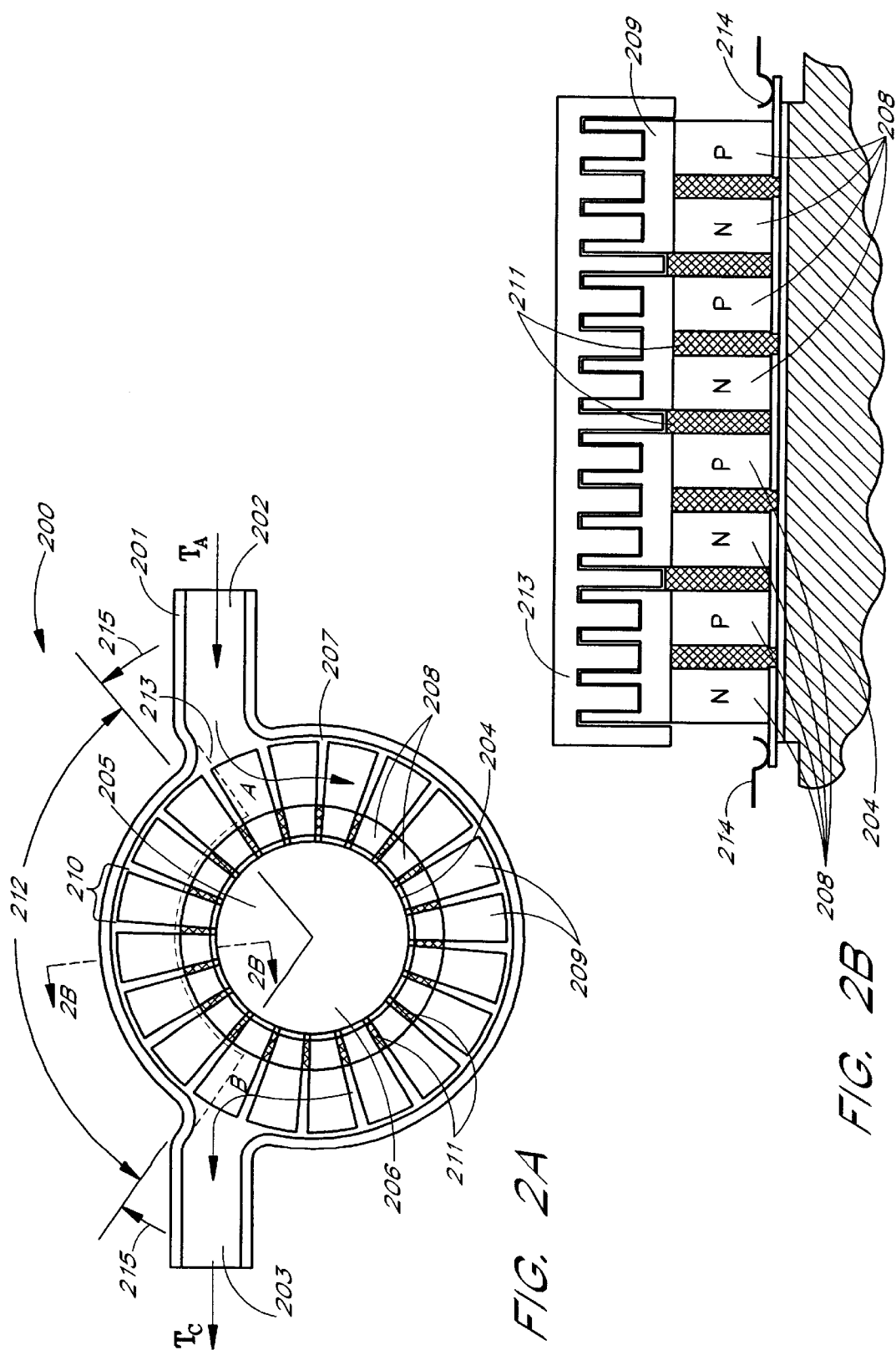

THERMOELECTRIC TRANSIENT COOLING AND HEATING SYSTEMS

REFERENCE TO PRIOR APPLICATIONS

This application is related to and claims the benefit of the filing date of prior filed U.S. Provisional Patent Application No. 60/267,657 filed Feb. 9, 2001.

BACKGROUND OF THE INVENTION

1. Field of the Invention

The present invention relates to improved thermoelectrics for producing heat and/or cold conditions with greater efficiency through operation in a non-equilibrium condition.

2. Description of the Related Art

Thermoelectric devices (TEs) utilize the property of certain materials to develop a thermal gradient across the material in the presence of current flow. Conventional thermoelectric devices utilize P-type and N-type semiconductors as thermoelectric material within the device. These are physically and electrically configured in such a manner that the desired function of heating or cooling is provided.

Several configurations for thermoelectric devices are in current use for automobile seat cooling systems, for portable coolers and refrigerators, for dispensing systems, for scientific applications, for cooling electronics and fiber optic systems, for cooling infrared systems and many other uses. However, Conventional TEs have many sources of inefficiency, and the current efficiency levels of conventional TEs limits their practical applications.

Some fundamental equations, theories, studies, test methods and data related to TEs for cooling and heating are described in Angrist, Stanley W., Direct Energy Conversion, 3d Edition, Allyn & Bacon, Inc., Boston, Mass. (1976). The most common configuration used in thermoelectric devices today is illustrated in FIG. 1A. Generally, P-type and N-type thermoelectric elements 12 are sandwiched in an assembly 10 between two substrates 14. The thermoelectric elements 12 are connected in series via copper shunts 16, soldered to the end of the elements 12. A current, I, passes through both element types. A DC voltage 18, when applied, creates a temperature gradient across the TE elements.

SUMMARY OF THE INVENTION

As described in further detail in this description, the losses in a thermoelectric (TE) device can be reduced by operating the TE in a non-equilibrium condition. The specific operation can be understood by referring to FIG. 1B, which shows the evolution of the temperature profile 100 of a TE element with a cold side 101 at O and a hot side 106 at L. The hot side 106 is a heat sink and does not change temperature with time. The cold side's 101 temperature decreases with time, and eventually reaches the time independent equilibrium profile 104 at $t_s$ and cold side 101 temperature $T_{CS}$. The cool side's 101 equilibrium temperature $T_{CS}$ depends in part on the amount of thermal power being transferred at the cold side 101 to cool a working fluid or an object placed at that location.

The temperature $T_A$ shows the TE element at uniform temperature before current is applied. The temperature profile 102, at time $t_1$, depicts the temperature distribution shortly after current is first applied, but well before equilibrium is established at time $t_s$. At time $t_1$, the cold side 101 temperature is $T_{C1}$. At point $X=X_1$, the temperature moves above ambient, $T_A$, due to Joule heating within the TE element. At X=L, the hot side 106 temperature is $T_A$ due to the imposed heat sink condition. Similarly, at a slightly later time, $t_2$, the cold side 101 temperature $T_{C2}$, is lower and the position, X, within the TE at which the TE element is at temperature $T_A$ has moved to the left to $X=X_2$.

Until the time $t_5$, a portion of the Joule heating in the element is conducted to the heat sink at the hot end 106. At $t_5$, that effect is zero. For slightly longer times, heat will be conducted from the heat sink 106 into the TE element. Thus, up to $t_5$, no heat enters the TE element from the hot end 106 heat sink, so that all the cooling at X=0, is conserved within the element. In addition, some of the losses from Joule heating have been transported out the hot side 106, thereby slightly reducing the amount of Joule heating of the TE element.

These combined effects can be used to reduce cooling loss from the TE element and thereby provide a net benefit. Similar benefits are achievable in the heating mode and with TE systems that have separate sections to cool and heat working fluids.

Representative designs that utilize this effect are described in the figures that follow. These designs and related designs that exhibit the same or similar performance are also a part of the present invention.

A thermoelectric system is disclosed that has a plurality of thermoelectric elements forming at least one thermoelectric array with at least one first side and at least one second side exhibiting at least one temperature gradient between them during operation. The thermoelectric elements are in thermal communication with at least one heat exchanger on at least the first or the second side, wherein at least a portion of the thermoelectric array is configured to be operated between or among at least first and second different current levels, wherein at least the first current level is below a current level that provides substantially maximum steady-state TE cooling or heating. In one embodiment, the operation between at least first and second current levels is substantially transient or non-equilibrium at each level. Preferably, at least some of the thermoelectric elements exchange heat with at least one working fluid while such thermoelectric elements operate at the first current level and/or while such thermoelectric elements operate at the second current level. Advantageously, the first current level is substantially below a current level that provides substantially maximum steady-state TE cooling or heating, and in one embodiment, is substantially zero. In one embodiment, the second current level is below, at or above a current level that provides substantially maximal steady-state TE cooling or heating.

The current level may be varied among at least the first and the second levels, varied between these levels, and/or varied among or between programmed levels. The current levels may also be varied to provide a cyclic pattern, such as a sine wave, or the like. The levels are preferably selected to provide improved efficiency over steady-state operation.

In one described example, the at least one thermoelectric array is configured to move such that at least some of the thermoelectric elements couple to at least one power source for a predefined period of time, and decouple from the at least one power source for a predefined period of time. This configuration may provide for at least some of the thermoelectric elements exchanging heat with at least one working fluid while decoupled from the power, and/or while coupled to the power.

An additional enhancement can be obtained by configuring the thermoelectric elements such that their active circuit or resistance is adjusted. In one described embodiment, the thermoelectric array is configured in a generally circular configuration, and is configured to rotate in a first direction about an axis of rotation, and at least one working fluid travels along at least one heat exchanger in a direction opposite of the direction of rotation. Similarly, the at least one working fluid may travel along the at least one heat exchanger in the first direction. The thermoelectric may be used for cooling, heating, or both cooling and heating.

A method of improving efficiency in a thermoelectric system having a plurality of thermoelectric elements is also disclosed. The method involves forming at least one thermoelectric array having at least one first side and at least one second side exhibiting at least one temperature gradient between them during operation. Power is applied to at least some of the thermoelectric elements in the at least one thermoelectric array in a non-steady state manner to operate the at least some of the thermoelectric elements among or between at least first and second different current levels, wherein at least the first current level is below a current level that provides substantially maximum steady-state TE cooling or heating.

In one embodiment, at least some of the thermoelectric elements exchange heat with at least one working fluid. At least some of the thermoelectric elements may exchange heat with at least one working fluid while such thermoelectric elements operate at the first current level and/or while such thermoelectric elements operate at the second current level. Preferably, the first current level is substantially below a current level that provides substantially maximum steady-state TE cooling or heating. In one embodiment, the first current level is substantially zero.

The current levels may be preprogrammed, variable, or otherwise applied. The current may be applied in a cyclic pattern as well. In one example, the step of applying power to at least some of the thermoelectric elements involves coupling the thermoelectric elements to a power source for a predefined period of time, and disconnecting these thermoelectric elements for a predefined period of time.

An additional step involves adjusting the resistance of at least some of the thermoelectric elements.

BRIEF DESCRIPTION OF THE DRAWINGS

FIG. 2A depicts a TE device that utilizes transient effects to achieve cooling.

FIG. 2B depicts details of a rotating seal portion of the cooling device in FIG. 2A.

DETAILED DESCRIPTION OF THE PREFERRED EMBODIMENTS

The present invention is introduced using examples and particular embodiments for descriptive and illustrative purposes. Although a variety of examples are presented to show how various configurations can be employed to achieve the desired improvements, the particular embodiments are only illustrative and not intended in any way to restrict the inventions presented. It should also be noted that the term thermoelectric element as used herein can mean individual thermoelectric elements as well as a collection of elements or arrays of elements. Further, the term thermoelectric is not restrictive, but used to include thermoionic and all other solid-state cooling and heating devices. In addition, the terms hot and cool or cold are relative to each other and do not indicate any particular temperature relative to room temperature or the like. Finally, the term working fluid is not limited to a single fluid, but can refer to one or more working fluids.

Unless otherwise stated, the descriptions that follow are described from the standpoint of a cooling device; i.e. the main output is cool fluid, the waste is warm. The opposite sense can be achieved by reversing the polarity of the thermoelectric device's power.

Figure 1A:
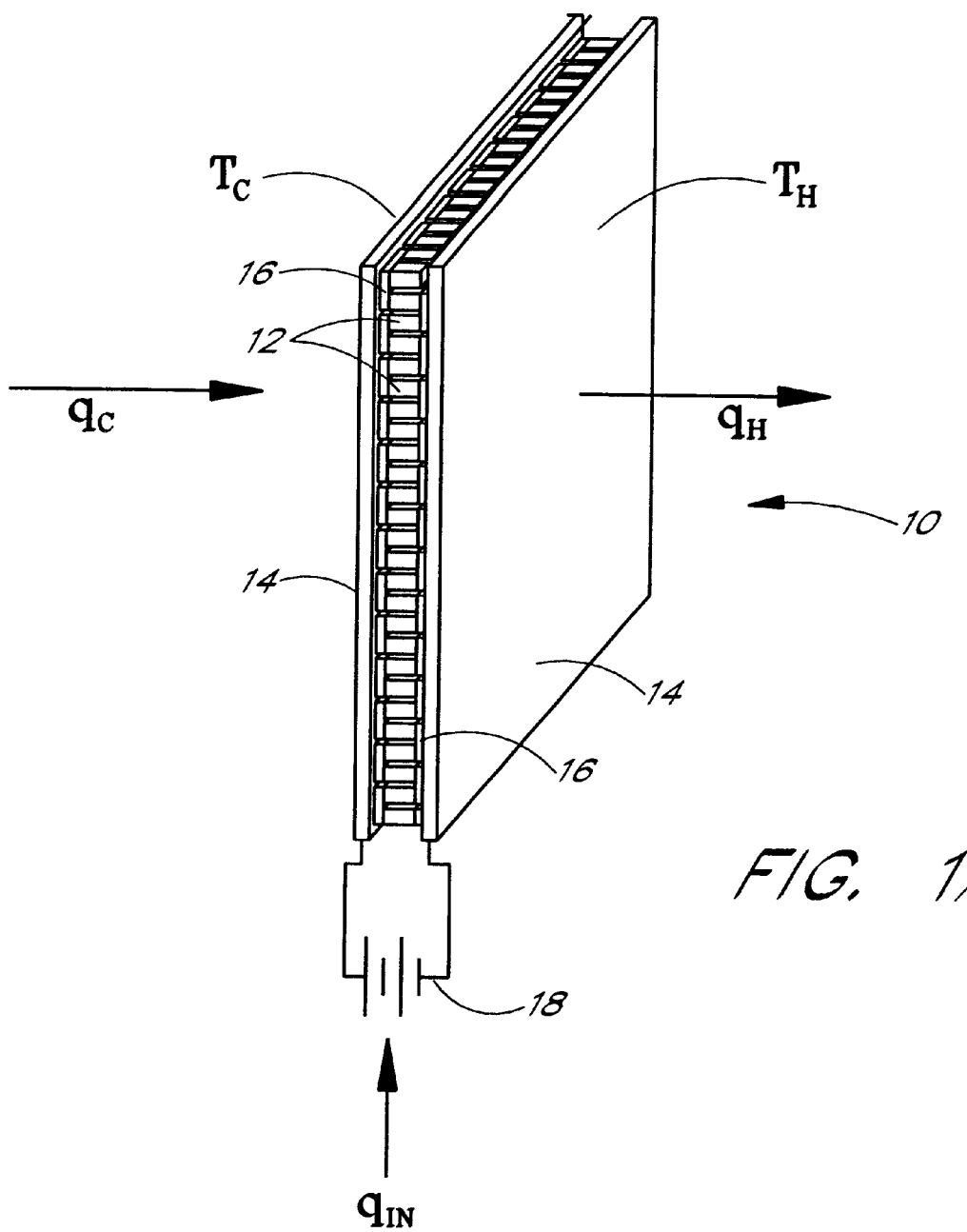
FIG. 1A depicts a conventional TE.
Figure 1B:
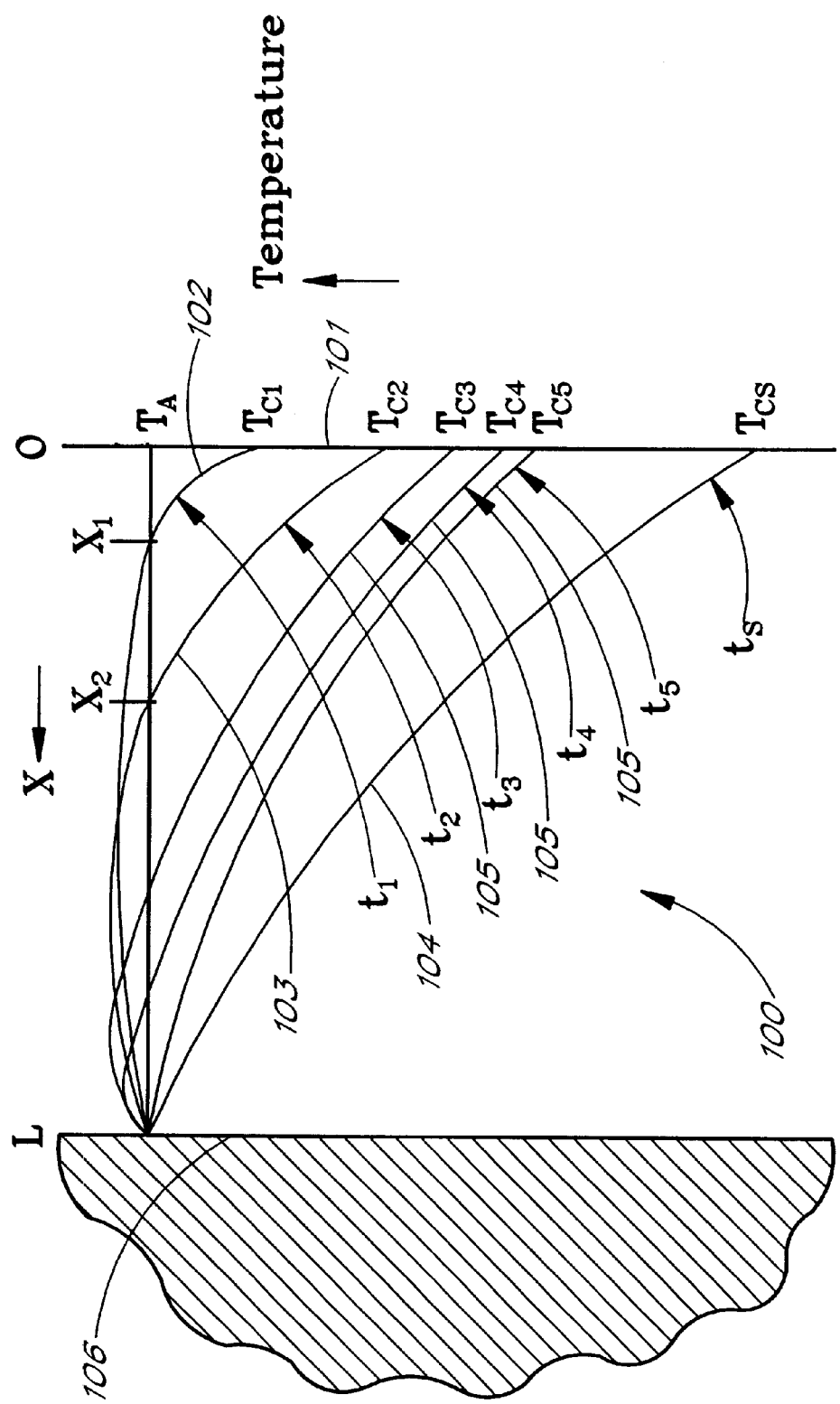
FIG. 1B depicts transient temperature profiles within a TE element.

FIG. 1B has been described above. The principles of that discussion are employed in the further descriptions that follow. In addition, in the devices that follow, the circumstances may occur under which the elements are powered transiently so that the temperature profile for the element is up to that of $t_s$. In the present description, normally, the operating temperature of the cool side, for example, for non-equilibrium power application, falls between $T_A$ and the steady-state temperature, $T_{CS}$, that is substantially the maximum cold (minimum temperature) for steady-state current operation of the TE. Advantageously, this may be done to increase thermal power transfer and, in some cases, to increase overall system efficiency. It should also be understood that the term transient is not restricted to "power-on" and "power-off" states, or any particular duty cycle or on-time. It is merely used to describe non-equilibrium power application or variation to at least some of the TE elements in a TE system.

FIGS. 2A (the general arrangement) and 2B (cross section through line 2B—2B normal to the plane of 2A) show an embodiment of a thermoelectric cooler 200 that exploits the effects of transient powering of the thermoelectric elements.

Transient operation of TEs for cooling and heating can benefit the performance of thermoelectric systems that are constructed of materials or have thermoelectric element dimensions that exhibit high thermal fluxes. Examples of such systems are systems with conventional Bismuth/Tellurium/Selenium alloys with elements less than 0.5 mm thick, hetrostructure elements, typically around 5 microns thick, and systems using high thermal conductivity materials such as some clathrates and metal alloys. To achieve high efficiency in systems with high heat flux rates, thermal losses can be reduced by powering the thermoelectric elements in a transient mode, using configurations that employ the concepts described herein. Further, transient mode operation often can have very small initial temperature difference between the thermoelectric element interfaces which allows efficient operation for at least part of an operating cycle at electric current densities lower than that for efficient operation under steady state conditions.

The transient operation is provided generally to improve efficiency. The transient powering generally occurs between at least two current levels. More than two current levels may also be selected. Preferably, a first current level is at zero or some non-zero current level below a level that results in the substantially maximal steady state TE cooling. Preferably, for a non-zero first current level, the level is substantially below the level that results in substantially maximum steady state TE cooling. At least a second current level is below, at or above the current level that results in substantially maximum steady state TE cooling.

The current levels are generally selected to obtain improved efficiency. As mentioned above, in a preferred embodiment, the currents are provided in a non-equilibrium manner, such as switched on and off, or varied in some pre-programmed or cyclic manner, to obtain a cold (or hot) side temperature that changes (preferably significantly below ambient for cooling) to a minimum temperature (in cooling) obtained through steady-state current application to the TE system ($T_{CS}$). In the description below, the TEs are operated by switching between at least the first and second current levels. Switching between three or more current levels may also be utilized. This should be distinguished from systems wherein cooling above that of maximum steady-state cooling can be obtained from a TE by temporary increases in current above the steady-state current level that provides substantially maximum steady state cooling (for cooling) or heating (for heating).

The device is enclosed by a housing 201 that has an inlet port 202 and an outlet port 203. Within the housing 201 is a central hub 204 divided into a section of good thermal conductivity 205 and a section of good thermal insulation 206. Between the hub 204 and the housing 201 is a substantially circular array 207 of sections 210 of thermoelectric elements 208 in good thermal contact at their outer ends with heat exchanger 209 (fins, for example, as depicted in FIG. 2B). There is insulative material 211 between the sections 210 and between the thermoelectric elements 208. Attached to the housing 201 over a portion 212 of the circumference is a flow-blocking shroud 213. The portion 212 covers an angle substantially the same as that covered by the thermally conductive section 205 of the hub 204. The flow-blocking shroud 213 fills in the spaces between but does not touch the fins of the heat exchanger fins 209. The gaps between the flow-blocking shroud 213 and the fins are small enough to effectively block the flow of the heat exchanger medium. Electrical power is supplied to the thermoelectric elements 208 by sliding contacts 214 which are positioned such that electrical contact with the terminals of any section 210 is maintained only while that section is within the flow-blocking shroud 213. For cooling, the polarity of the electrical power is such that the ends of the thermoelectric elements 208 in good thermal contact with the heat exchanger fins 209 become cooler.

The housing 201, the flow-blocking shroud 213, and the hub 204 are stationary. The circular array 207 rotates counter clockwise. The heat exchanger fluid (liquid, slurry or gas) enters the device through the inlet port 202 at temperature $T_A$ and passes clockwise through the heat exchanger fins 209 that are not within the flow-blocking shroud 213. The heat exchanger fluid is also blocked from flowing among the thermoelectric elements 208 by the insulative material 211. The heat exchanger fluid exits the device through the exit port 203. Thus, the device is divided into two regions, the powered region 213 wherein the TE elements 208 and fins 209 are cooled and the unpowered region 215 wherein the heat exchange with the heat exchanger fluid takes place so that the fluid is cooled.

It should be understood, that although the TE system of FIG. 2 illustrates powered and unpowered regions, it could also be configured with two or more different current levels for the two different regions, other than zero and non-zero current levels.

The rate of rotation of the circular array is chosen such that during the time spent by the sections 210 within the flow-blocking shroud 213 (within which they are powered) the sections achieve the desired temperature differential across them. Additionally, the sections 210 spend enough time in the unshrouded portion of their rotation so that they substantially return to ambient temperature by exchanging heat content between the heat exchanger fluid and the fins 209. Thus, in FIG. 2A, the heat exchanger fluid begins to cool as it enters at the port 202 at one end of section A and reaches a cold temperature $T_c$ as the fluid exits the port 203. Waste heat is collected in the thermally conductive section 205 of the hub 204. This waste heat is prevented from flowing back into the TE elements 208 as they transit the heat exchanger region 215 by the insulative portion 206 of the hub 204.

FIG. 2B depicts a section through the device in which a multiplicity of TE elements 208 are arrayed and connected electrically so that current flows from one end of the array at a contact 214 to the other end. Current flow in one direction will cool the fins 209, and current flow in the opposite direction will heat the fins 209. The number of TE elements 208 so aligned can be one or more, but advantageously an even number so as to facilitate electrical connection to the rotating hub 204. Preferably, each row of TE elements 208 so constructed has the contact 214 arrangement depicted in FIG. 2, electrically isolated at at least one end from the other rows. By this design, each row can be electrically powered independently of the other rows.

It can be advantageous to vary the current as the temperature difference across a TE element 208 increases. Current may be varied in many different manners, as mentioned above. The present illustrations are not limited to one zero level and one or more non-zero current levels. As mentioned above, current may be varied cyclically, through a programmed sequence of current transitions, or in any manner that varies the current in a no-equilibrium manner to obtain gains in efficiency. Further, thermal isolation between rows is advantageous as taught in copending U.S. application Ser. No. 09/844,818, filed Apr. 27, 2001, which is incorporated by reference herein. In addition, the efficiency gains from convection, as described in U.S. patent application Ser. No. 09/860,725, entitled Efficiency Thermoelectric Utilizing Convective Heat Flow, filed May 18, 2001, which is incorporated by reference herein, may also be combined with the principles and configurations described herein.

Figure 3:
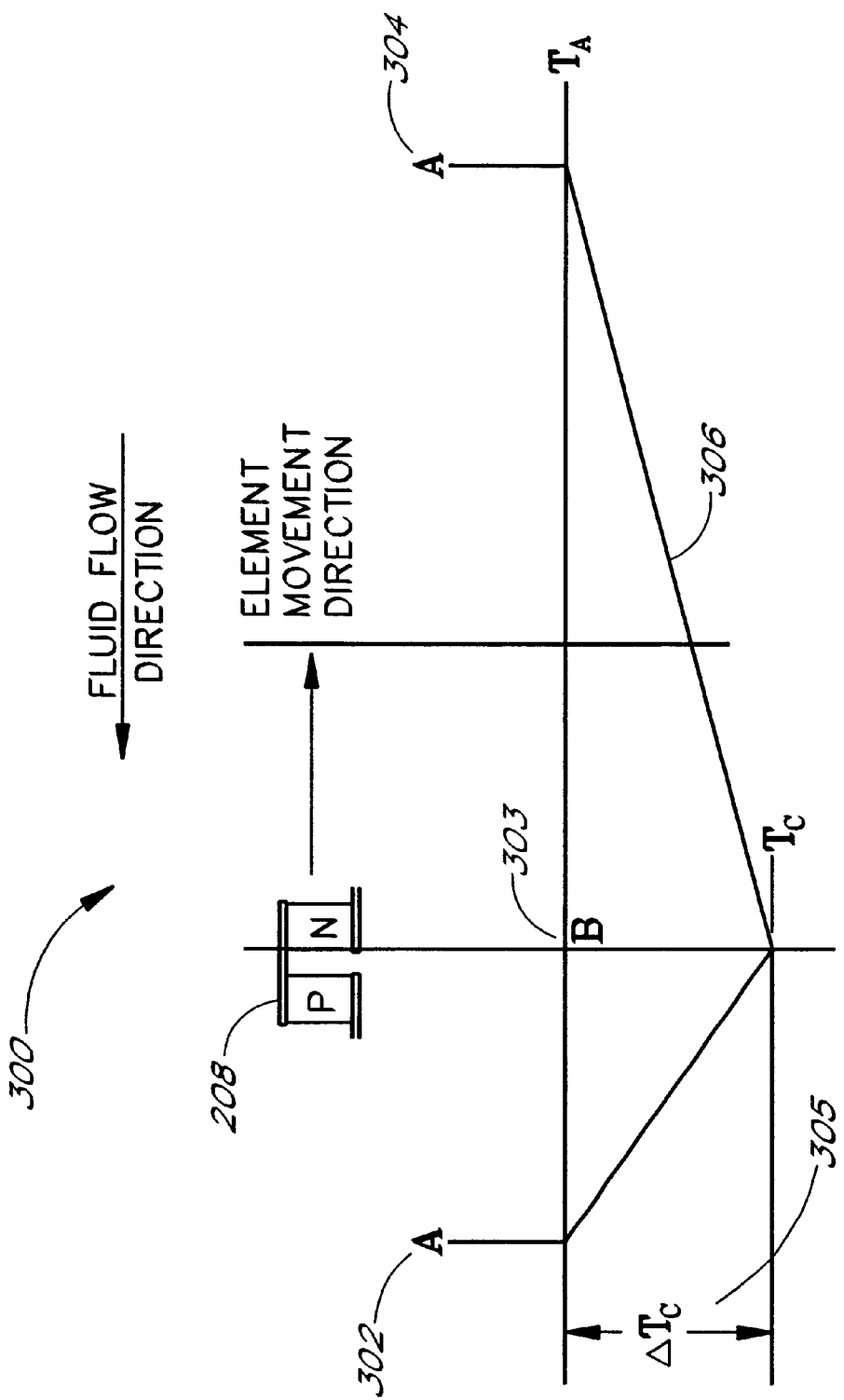
FIG. 3 shows the temperature profile of a typical cold side of a TE element as the TE element moves in a fluid stream.

FIG. 3 depicts the temperature profile 300 in the curve 306 of the cold side heat exchanger 209 for a TE element 208 of FIG. 2. At point A, 302, the cold side exchanger is effectively at $T_A$. At point B 303, the cold side is at temperature $T_C$. When the element 208 returns to position A 304 again, the cold side has returned to a temperature $T_A$.

As the elements 208 moves from position A 302 to position B 303, they are cooled to $T_C$ so that the temperature at the cold side heat exchanger 209 has dropped by $\Delta T_C$ 305 to $T_C$. At the point B 303, current flows to those particular TE elements 208 stops, and the TE elements 208 rotate counterclockwise into the fluid stream of FIG. 2, near the outlet port 203. As a particular portion of the cold end heat exchanger 209 rotates from position B to A counterclockwise, it absorbs heat from the fluid stream of FIG. 2 and warms up to a temperature $T_A$ at position A 304 as shown by curve 306. At that point 304, the TE elements 208 with a portion of the accompanying heat exchanger 209 rotate out of the fluid stream near the inlet port 202. Point A 304 is the same physical location as point A 302 so the elements 208 again have current applied as they transition to point B 303, repeating the cycle. The temperature profile of the fluid throughout the heat exchanging region 215, preferably changes substantially linearly from $T_A$ to $T_c$ as the heat exchanging fluid travels from section "A" at the inlet port 202 to section "B" at the outlet port 203.

The major parameters that determine the cycle speed are the current applied, the thermal mass of the TE elements 208 and heat exchanger 209 assembly, the working fluid properties and the fluid flow rate.

Figure 4B:
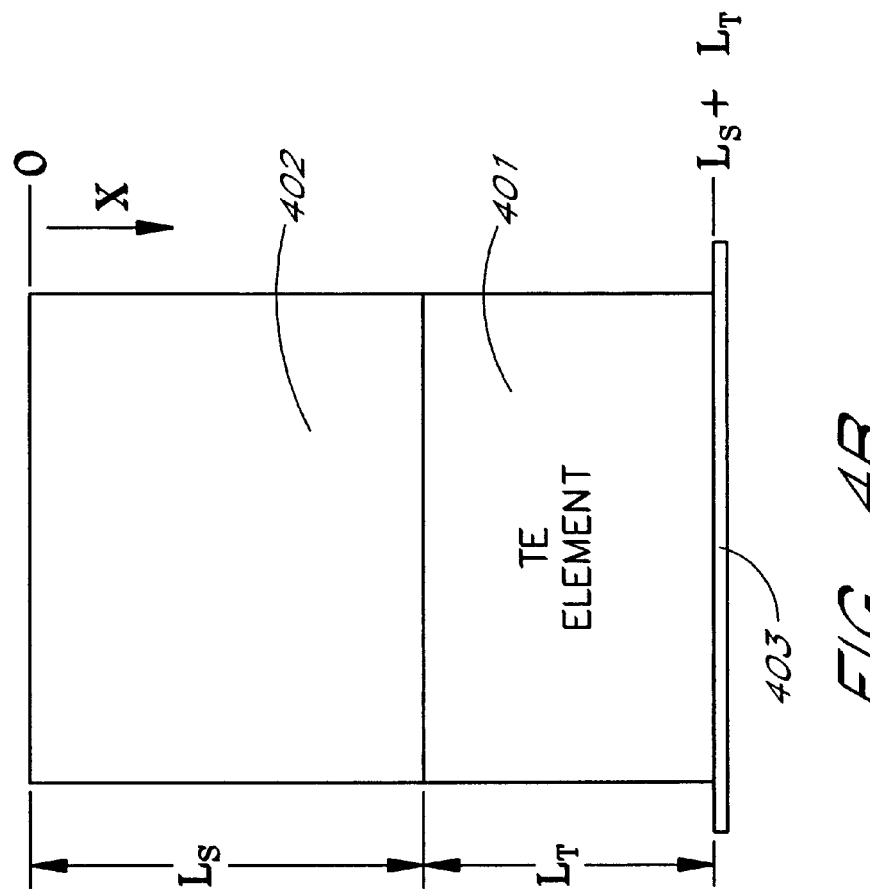
FIG. 4B shows dimensions that describe the assembly of FIG. 4A.
Figure 4A:
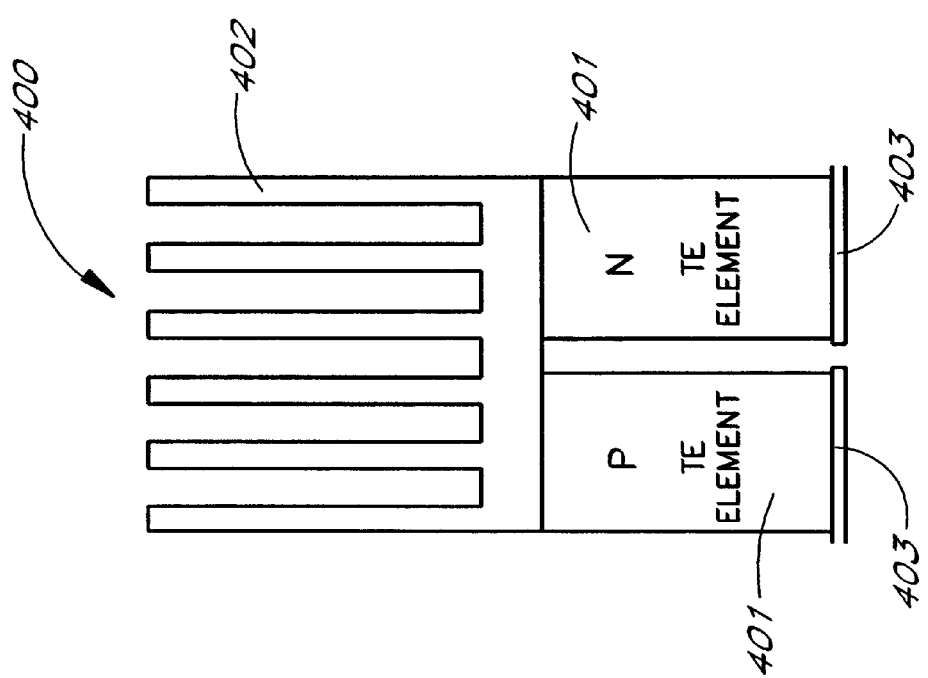
FIG. 4A depicts a TE element and attached thermal mass/fin.

In FIG. 4A, a TE element assembly 400 consists of N-type and P-type TE elements 401, lower electrodes 403 and an upper heat exchanger 402 (fins in the depicted embodiment). In the example, the heat exchanger 402 is also the upper electrode electrically connecting the TE elements 401.

The TE element assembly 400 operates by passing current (not shown) from the left lower electrode 403 through the left TE element 401 through the heat exchanger 402 through the right TE element 401 and finally through the right lower electrode 403, as is well known in the art. Depending on the direction of current flow, the heat exchanger 402 is either cooled or heated.

FIG. 4B depicts the same geometry with the same definitions as FIG. 4A, except that length $L_S$ has been added to better define the heat exchanger 402. Similarly, a length $L_T$ has been added to the TE elements 401.

Along with its thermal capacity and weight, the length $L_S$ helps define the thermal mass and heat flow characteristics of the heat exchanger 402. Similarly, $L_T$, helps define the thermal capacity, and the weight of the TE elements 401 and thus determines their thermal mass and heat flow characteristics. Advantageously, the ratio of the thermal mass of the heat exchanger 402 is 1 to 50 times that of the TE elements 401. The actual value depends on the desired operating characteristics of the entire TE device such as size, speed of TE assembly rotation, working fluid flow rates, and the like. Generally, the larger the ratio, the closer to quasi-equilibrium is the operation of the complete system.

Figure 5:
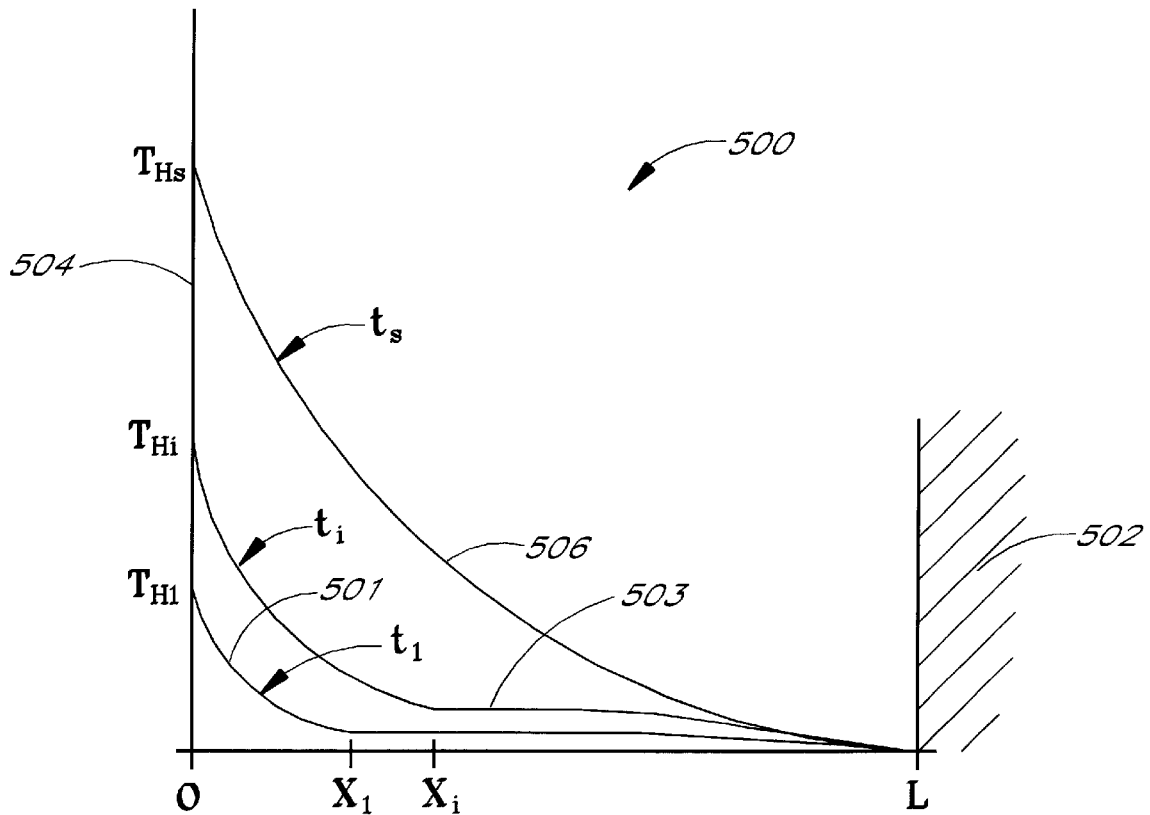
FIG. 5 shows transient temperature profiles for heating of a TE element.

FIG. 5 shows the temperature profile 500 of a TE element with hot side 504 at X=0 and cold side heat sink 502 at L at temperature $T_A$. The hot side 504 at X=0 has the temperature profile 501 at time $t_1$, shortly after power is applied, the hot side 504 is at temperature $T_{H1}$, and the heat from the hot side 504 had penetrated $X_1$, at that time. The final temperature profile 506 is $t_S$, the temperature at the hot side 504 is $T_{HS}$, and at that time, the steady state temperature profile 502 is established. At an intermediate time, the profile 503 at time $t_i$ occurs with hot side 504 temperature $T_{Hi}$ and position $X_i$ is where the heat from the hot side 504 has diffused to at time $t_i$.

In the heating mode, the Joule heating in the element contributes, except a small portion is lost to the heat sink 502, as shown by the slope of the curves 501, 506 and 503 at the heat sink 502. Advantageously, the TE 500 is powered until the depth of penetration of the heat into the TE, point $X_i$, reaches L. Notwithstanding this condition, the TE 500 may be powered for longer times, including times that allow the TE element to reach the equilibrium temperature profile $t_s$. For example, this could be done to increase thermal power transfer, and in some cases to increase overall system efficiency.

Figure 6:
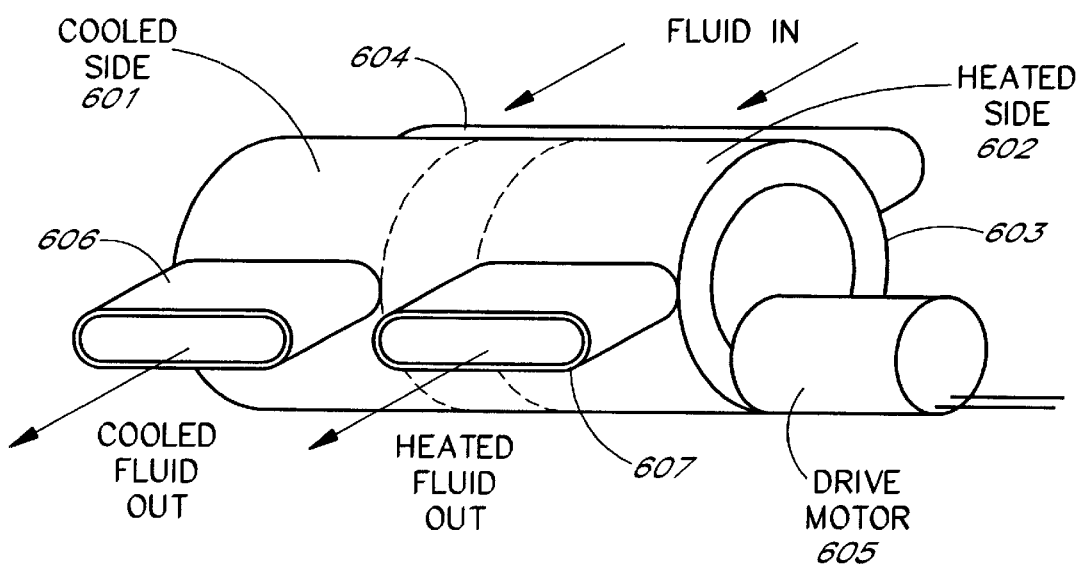
FIG. 6 depicts a TE device that cools and heats one or more working fluids.

FIG. 6 shows an embodiment of two devices as described in FIGS. 2A and 2B joined so as to operate one in heating mode and one in cooling mode. The purpose of this arrangement is to transfer the heat collected in the thermally conductive section and to match the thermal transfer expelled from the device. Between a cooled side 601 and a heated side 602, all heat generated is in one side and transferred to the hub (internal to the device and functionality equivalent to the hub 204, 205, and 206 of FIGS. 2A and 2B). Advantageously, the cooled side 601 and the heated side 602 share a common housing 603, a common heat exchanging fluid inlet port 604, and a drive motor 605 along with the hub, which serves to transfer heat from the cooled side 601 to the heated side 602. Cooled and heated fluids exit the device through their respective outlet ports 606 and 607.

Figure 7:
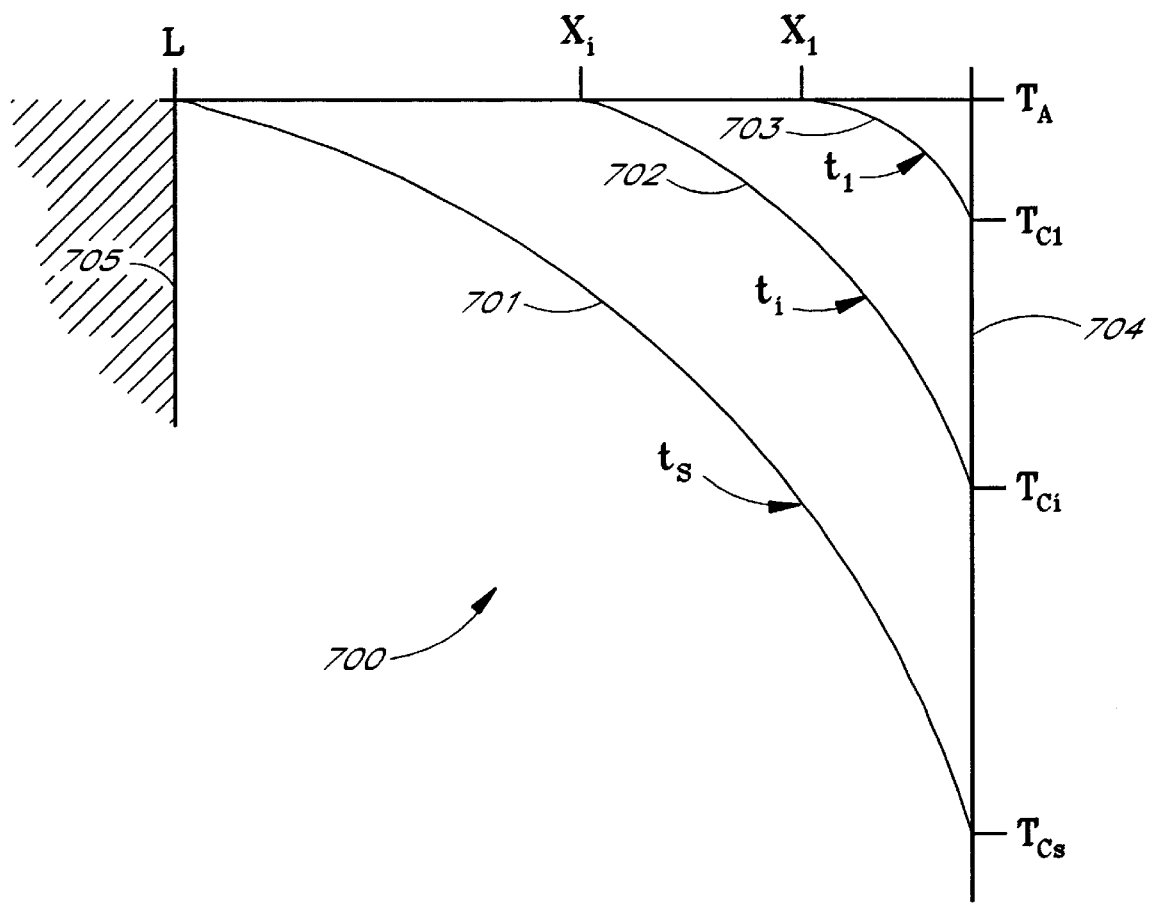
FIG. 7 shows the transient temperature profile of a TE element with an effective active length that changes with time.

FIG. 7 depicts the temperature profiles 700 for a TE with a cooled side 704 and a heated side 705, with a heat sink 708 with power applied so that at short time later at time $t_1$, the temperature profile 703 is as shown. At time $t_1$, point $X_1$ depicts the distance the coldness has penetrated the TE element at time $t_1$ The Profile 702 shows the similar condition at time $t_i$ Temperature profile 701 is the steady state profile.

This graph is presented to illustrate an additional benefit that can be obtained during transient power operation by eliminating resistive heating in portions of the TE, which are not effectively active during transient operation. This can be accomplished by having the circuit connections track, as a function of time, the position that heat or coldness has penetrated the TE.

For example, at time $t_i$, the Joule (resistive) heating in the part of the TE to the left of point $X_i$ can be eliminated by having the electric circuit to the TE end at $X_i$ such that the current path does not continue through the TE from $X_i$ to L. Thus the resistive path from $X_i$ to the end at X=L is eliminated, and that portion of the TE does not contribute to the electric power utilization in cooling (or the Joule heating in the heating mode), a portion of which is lost to the heat sink 708. As time passes, the circuit will encompass more of the TE until the time $t_s$ steady state is reached, the entire TE is encompassed in the circuit. Under some circumstances, the circuit path length may be to the right of the points $X_i$, or generally $X_i$, so that some thermal loss at the circuit attachment points $X_i$ will occur. Advantageously, this can be done to increase thermal power and in some cases, to increase overall system efficiency.

Figure 8A:
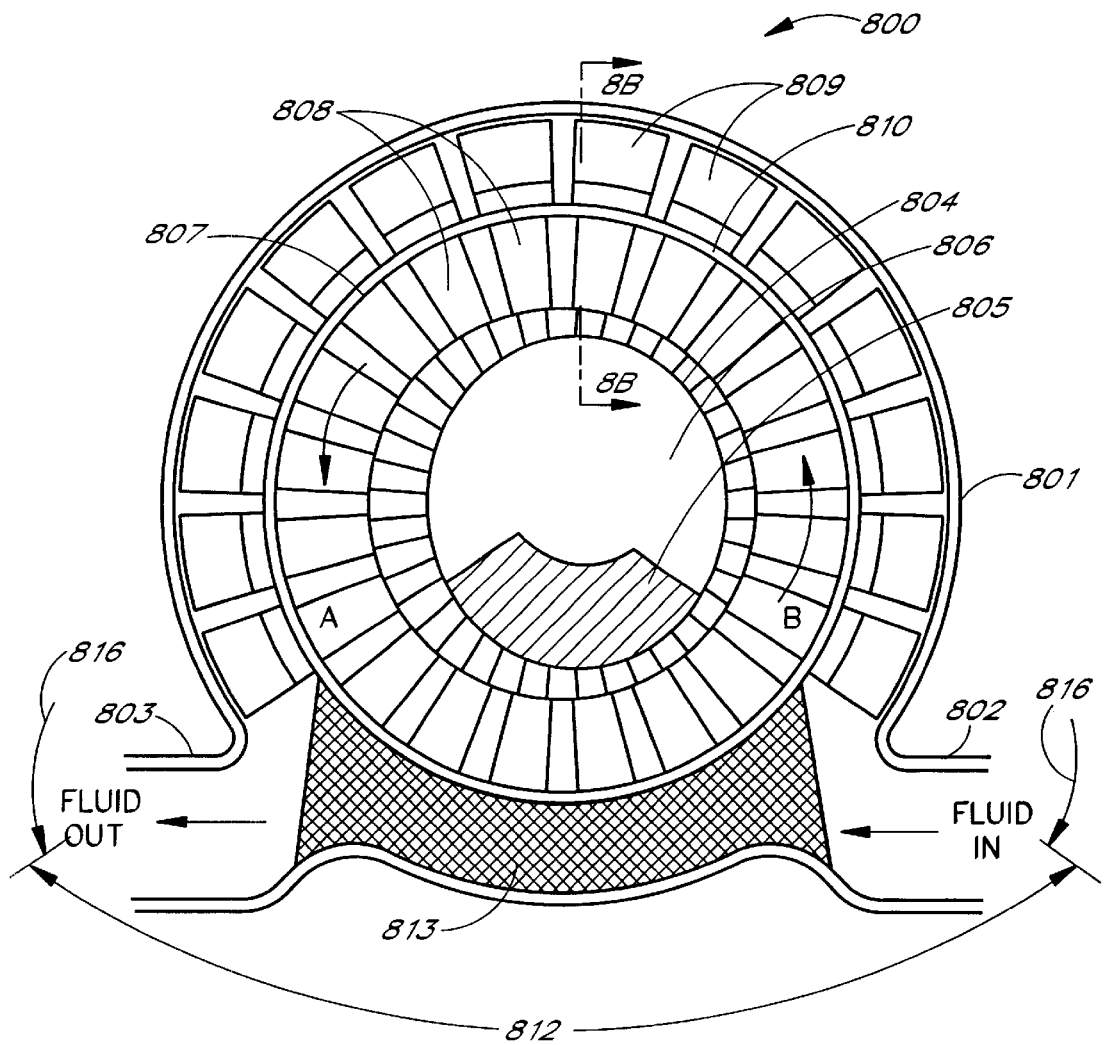
FIG. 8A depicts a TE device that utilizes TE elements whose active length changes with time.
Figure 8B:
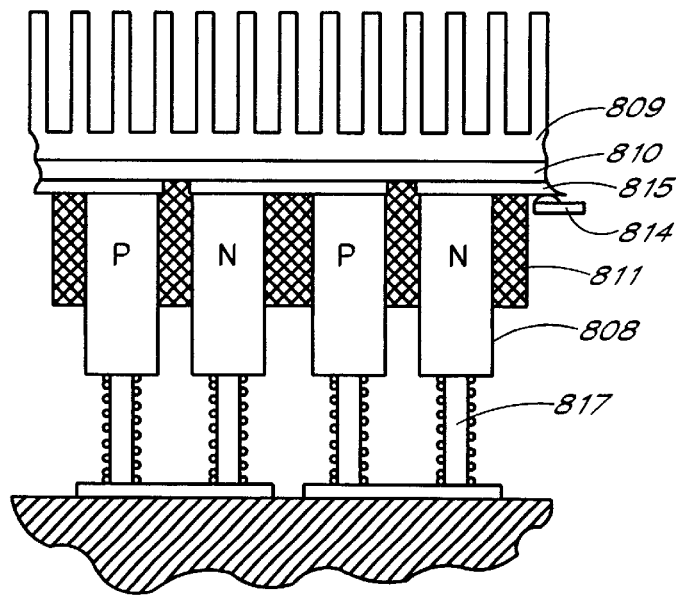
FIG. 8B depicts details of the TE elements of FIG. 8A.
Figure 9:
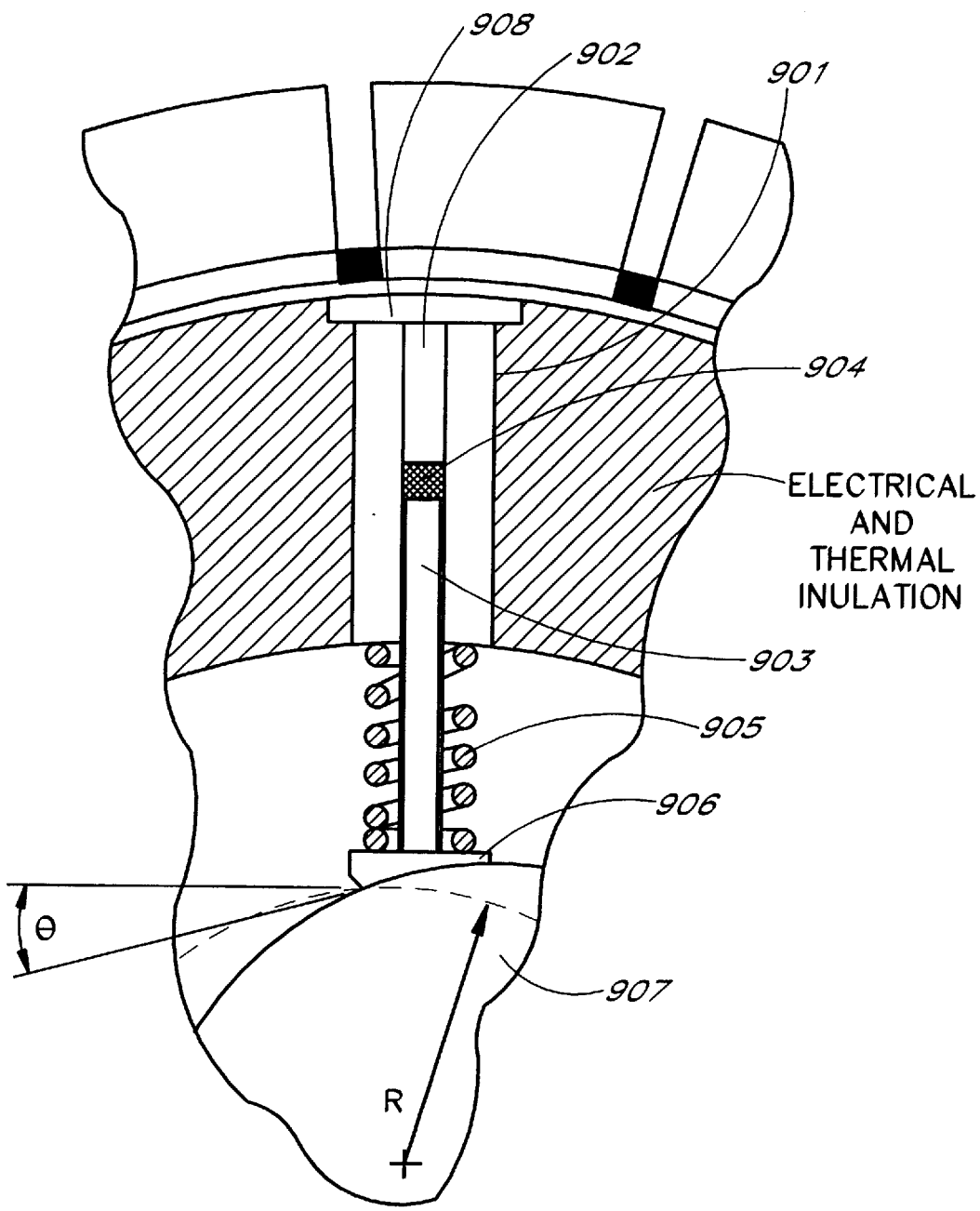
FIG. 9 depicts further details of the TE elements and their interaction with cam surfaces of FIG. 8A.
Figure 11:
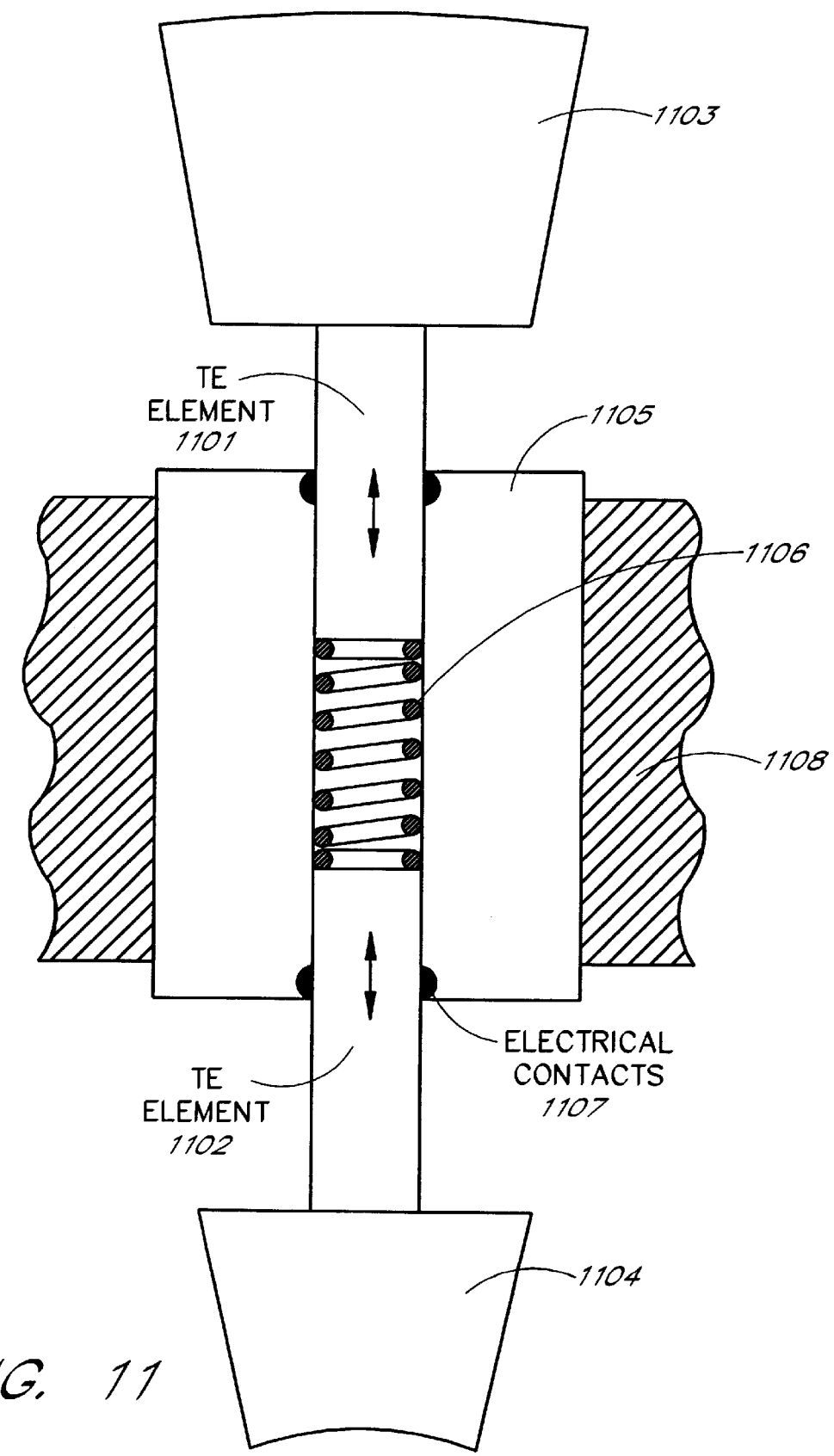
FIG. 11 depicts details of a TE element of the TE device of FIG. 10.

This effect can be accomplished, for example, by the designs depicted in FIGS. 8B, 9 and 11, but the present invention encompasses all configurations that exhibit the property of reducing thermal loss at the end opposite that being cooled (or heated) by changing the geometry or circuit path of the TE element with time as described above.

FIGS. 8A and B show an embodiment similar to that described for FIG. 2 with the exception that current flows in the angular portion of the assembly where heat transfer occurs to the working fluid and the addition of the ability to change the effective lengths, and hence the resistances, of the thermoelectric elements as a function of rotational position to obtain the benefit explained for FIG. 7. The purpose of this is to optimize the resistances of the elements according to the temperature profile changes with time as power is applied and the TE elements 808 rotate. An additional difference between the device of FIG. 8 and that of FIG. 2 is that in the device of FIG. 8, the heat exchanger fins do not rotate with the TE elements 808.

FIG. 8A is the general arrangement and FIG. 8B is a cross section along the line 8B—8B normal to the plane of 8A. The thermoelectric system 800 is enclosed by a housing 801 that has an inlet port 802 and an outlet port 803. Within the housing 801 is a central hub 804 divided into a section of good thermal conductivity 806 and a section of good thermal insulation 805. Within the housing 801, and fixed with respect to the housing, is a partial ring of heat exchanger fins 809 covering the region 816. Between the hub 804 and the heat exchanger fins 809 is a ring 807 of thermoelectric elements 808 whose outer ends are in good thermal communication with a thermally conductive material such as thermally conductive grease 810. There is electrically and advantageously thermally insulative material 811 (FIG. 8B) between the sections adjacent thermoelectric elements 808. Advantageously, flow within the region 812 is blocked by insulative material 813. The portion 812 of the thermoelectric system 800 covers an angle substantially the same as that covered by the thermally insulative section 805 of the hub 804. Electrical power is supplied to the thermoelectric elements 808 by electric circuitry or contacts 814, which are positioned such that electrical power to the terminals 815 is maintained while that corresponding thermoelectric section is outside of the flow-blocking region 812. For cooling, the polarity of the electrical power is such that the ends of the thermoelectric elements 808 that contact the thermally conductive grease 810 become cold. Opposite current flow heats as in FIGS. 2 and 5.

The housing 801, the flow blocking insulative material 813, and the hub 804 are stationary. The ring 807 of thermoelectric elements 808 rotates counterclockwise. The heat exchanger fluid (liquid, slurry or gas) enters the device through the inlet port 802 at temperature $T_A$ and passes counterclockwise through the heat exchanger fins 809. The heat exchanger fluid is also blocked from flowing around the thermoelectric elements 808 by the insulative material 811. The heat exchanger fluid exits the device through the exit port 803. Thus, the device is divided into two regions, the unpowered region 812 and the powered region 816 during which the heat exchange with the heat exchanger fluid takes place. The rate of rotation of the circular array is chosen such that during the time spent by the thermoelectric elements sections 808 within the flow blocking insulative region 812 (within which they are unpowered) to substantially return to equilibrium. In the powered region 816, the sections achieve the maximum desired temperature differential across them while exchanging a portion of the heat content removed to the fins 809 and thence to the heat exchanger fluid. Thus, in FIG. 8A, the heat exchanger fluid begins to cool at section A at port 802 and reaches a coldest (or hottest) temperature at the output port 803. Waste heat is collected in the thermally conductive section 805 of the hub 804. This waste heat is prevented from reaching the heat exchanger region 816 by the insulative portion 806 of the hub 804.

The hub 804 is either not circular or not centered on the center of rotation or both so as to act as a cam surface. The thermoelectric elements 808 are hollow and have provisions to vary their active length such as by the use of pistons 817 that operate on the cam surface to change the effective length and therefore the effective resistance of the elements. The details of the construction of an exemplary thermoelectric element 808 are described in FIG. 9.

The concepts presented in this FIG. 8 can be combined with those described in FIGS. 2A, 2B and 6 to both heat and cool, to vary electric current flow with position and to provide thermal isolation in the design of FIGS. 8A and 8B.

FIG. 9 is an enlargement of an example of a thermoelectric element as used in the device of FIG. 8. The thermoelectric element 901 itself is tubular. Within the central hollow 902 rides an electrically conductive piston 903 terminated with a sliding contact 904 and supported by an electrically conductive spring 905. The end of the spring 905 presses against a sliding contact surface 906 in good electrical contact with the electrically and thermally conductive portion 907 of the hub. At the outer end of the thermoelectric element is a cap 908. Contact 904 and cap 908 serve to connect the thermoelectric elements 901 together in series. The sliding contact 904 shorts out the inner portion of the thermoelectric element 901 to an extent determined by the piston 903 position as determined by the cam surface of the hub 907. The shape of the sliding contact surface 906 is determined by the angle-of-contact $\Theta$, and the radius R.

Figure 10:
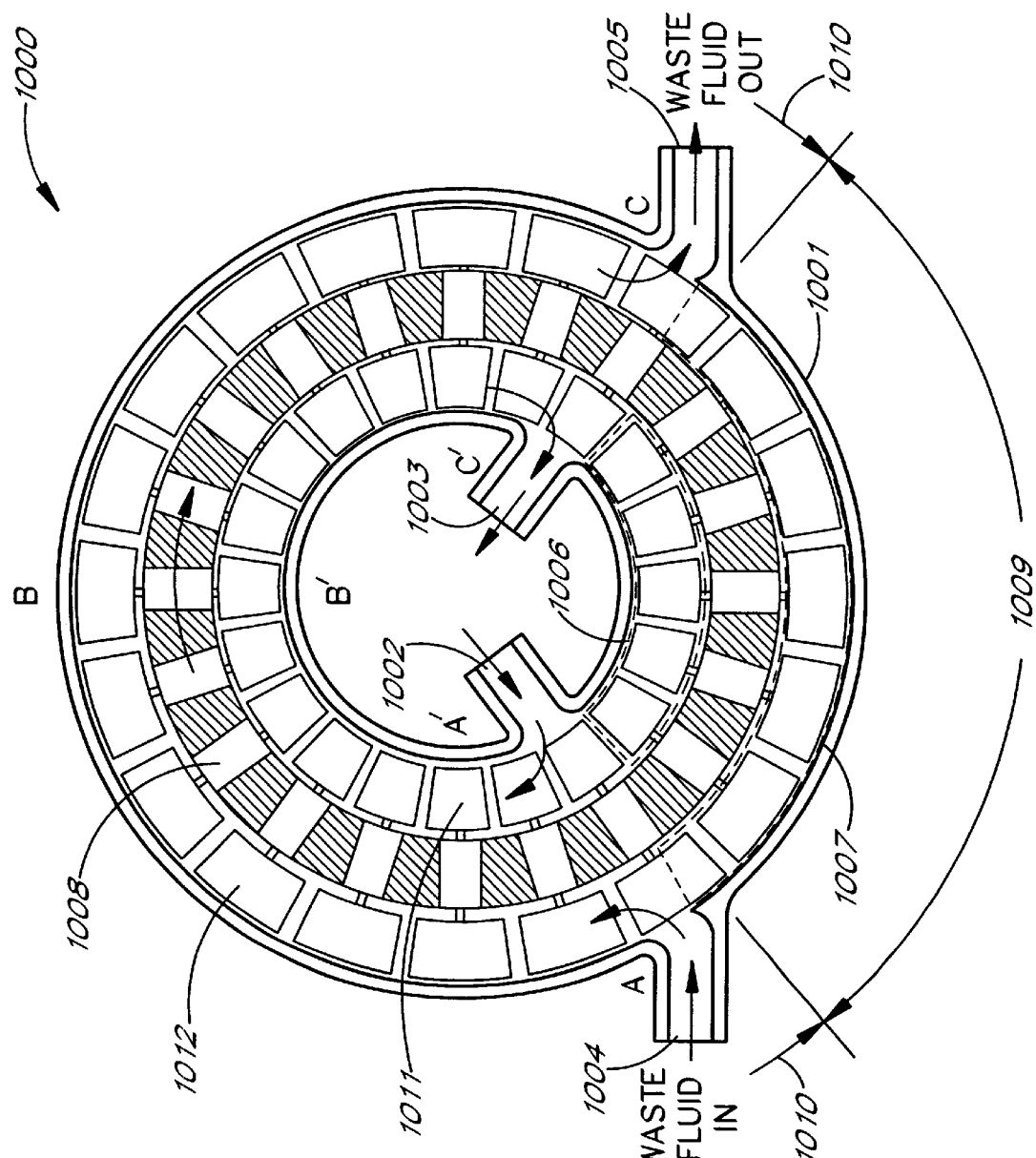
FIG. 10 depicts a cooling/heating TE device using variable active length elements.

FIG. 10 depicts yet another thermoelectric system 1000 utilizing transient powering of the thermoelectric elements. In this configuration, the device is contained within a housing 1001 having main inlet port 1002, main outlet port 1003, waste inlet port 1004, and waste outlet port 1005. Attached to the inside rim of housing 1001 is a flow-blocking shroud 1006 and attached to the outside rim of the housing 1001 is a second flow-blocking shroud 1007. These shrouds are constructed of insulative material and geometrically accomplish the same function as the shroud 213 of FIG. 2. Rotating clockwise within the housing is a ring of thermoelectric assemblies 1008. These thermoelectric assemblies consist of a main side fin heat exchanger 1011, a waste side fin beat exchanger 1012, and thermoelectric elements 1008 shaped as pistons separated by coil springs (not shown). A detailed description of the construction of the thermoelectric assemblies 1008 is in FIG. 11. The inner and outer rims of the housing 1001 are either not circular or not concentric or both so as to create a radial distance between them that varies as a function of angular position to obtain the benefit illustrated with FIG. 7.

As the ring of thermoelectric assemblies 1008 rotates, different amounts of the thermoelectric material within the elements 1008 are shorted, depending upon the radial distance between the inner and outer rims of the housing 1001. This effectively causes the resistance of the thermoelectric elements 1008 to change according to the geometry of the rims. The thermoelectric assemblies 1008 are powered only in the region 1010 and are unpowered in the region 1009. This is accomplished by making either the inner rim or the outer rim or both non-conductive throughout the region 1009. Fluid at ambient temperature $T_A$ enters the waste inlet port 1004 at A and travels clockwise to exit at the waste outlet port 1005 at C with temperature $T_H$. Similarly fluid at ambient temperature $T_A$ enters the main inlet port 1002 at A' and travels clockwise to exit at the main outlet port 1003 at C' with temperature $T_c$. Neither main nor waste fluid flow occurs within the shrouded, unpowered region 1009 by virtue of the flow-blocking shrouds 1006 for the main flow and 1007 for the waste flow. As a thermoelectric assembly 1008 enters the powered region 1010 just after passing A–A', it is initially at ambient temperature $T_A$ and begins to cool its inboard fins 1011 and heat its outboard fins 1012. This action continues throughout the powered region 1010 until it emerges from the powered region just before passing C–C' at which point the temperature differential across the assembly has reached the desired maximum. As the thermoelectric assemblies pass through the powered region 1010, they exchange heat with the main and waste fluid flows. In the unpowered region 1009 the assemblies return to near ambient temperature by the time they return to A–A'. Advantageously, the rotation rate, material thermal masses and electric current are chosen to accomplish the desired performance. Thus main side fluid is cooled as it moves from A' to C', and waste side fluid is heated as it moves from A to C. When operated as a heater, current is reversed and the fluid in the inner portion heats and that in the outer cools.

FIG. 11 shows an example of details of construction of the TE assemblies 1008 of FIG. 10. Advantageously, the assemblies are insulated thermally and electrically from each other by the material 1108. A waste side thermoelectric element 1101 is in good thermal contact with a waste side heat exchanger 1103 (typically a fin) at its outer end. Its inner end moves within a cylindrical hole in an electrically conductive tube 1105. Likewise, a main side thermoelectric element 1102 is in good thermal contact with a main side heat exchanger 1104 (typically a fin) at its inner end. Its outer end moves within the electrically conductive tube 1105. The ends of the two thermoelectric elements 1101 and 1102 are separated by, and loaded by a spring 1106. As the radial distance between the inner and outer rims of the housing 1001 of FIG. 10 vary, the spring adjusts the active length of thermoelectric elements 1101 and 1102 to obtain the resistive improvement of FIG. 7. The electrical path lengths through the TE elements 1101 and 1102 engage the electrical contacts 1107 at the ends of the electrically conductive tube 1105.

Figure 12A:
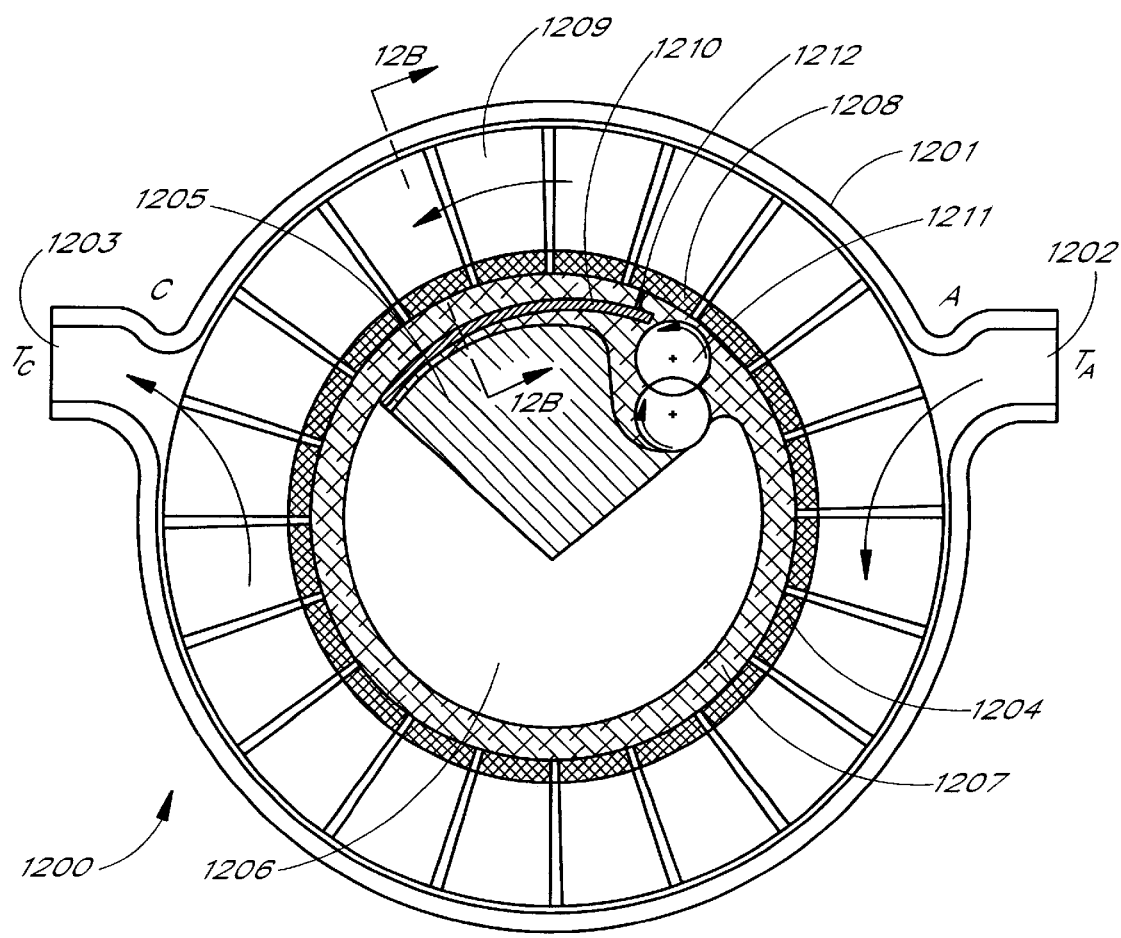
FIG. 12A depicts a TE device that employs a fluid or slurry TE material for transient cooling or heating.
Figure 12B:
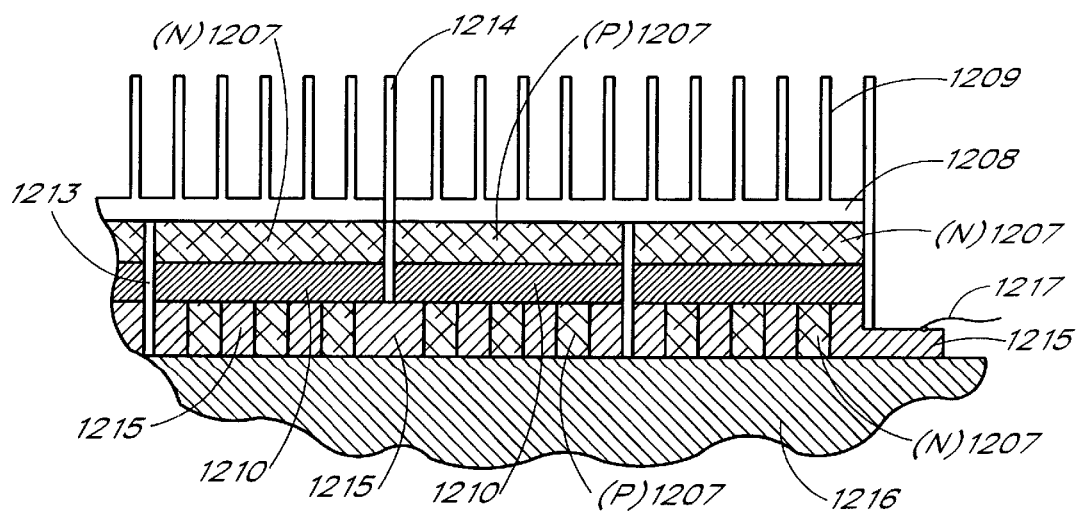
FIG. 12B depicts details of the structure of the electrode, TE material, heat sink, and fin of FIG. 12A.

FIGS. 12A (general arrangement) and B (cross section through line 12B—12B normal to the plane of 12A) depict another embodiment employing transient powering of a liquid thermoelectric material 1207. The device is contained within a housing 1201 having an inlet port 1202 and an outlet port 1203. In the center is a hub 1204 divided into two sections, one that is thermally conductive 1205 and one that is thermally insulative 1206. The hub is surrounded by liquid thermoelectric material 1207 which is in turn, surrounded by a ring of electrodes 1208 made of copper or other suitable electrically and thermally conductive material. Between the electrode ring 1208 and the housing 1201 is a ring of heat exchanging fin sections 1209 in good thermal contact with the electrodes 1208. The heat exchanging fin sections 1209 and the electrodes 1208 can be one piece. A porous electrically and thermally conductive electrode 1210 is positioned between the hub 1204 and the electrode ring 1208. The porous electrode 1210 extends substantially over the portion of the circumference occupied by the thermally conductive section 1205 of the hub 1204. Advantageously, a gear pump 1211 is provided to pump the liquid thermoelectric material 1207 through the porous electrode 1210. Fluid or slurry thermoelectric material 1207 is prevented from bypassing the porous electrode 1210 by the seal 1212. As seen in FIG. 12B, the device consists of layers of the construction described in FIG. 12A with alternating N and P type liquid thermoelectric (N) 1207 and (P) 1207 materials. Electrical separation of the layers as well as sealing between layers is achieved with seals 1213 and 1214. The electrode 1210 is connected to high electrical and thermal conductivity members 1215 that transmit thermal power to the thermally conductive portion of the hub 1205. The members 1215 are separated by radial slots that allow thermoelectric material 1207 to pass between the electrode 1210 and the hub 1204. Contacts 1217 connect to an electrical power source.

In operation, the fins 1209 and electrodes 1208 rotate counter-clockwise in unison. The housing 1201, the porous electrode 1210 and the hub 1204 remain stationary. Fluid or slurry thermoelectric material 1207 is pumped counter-clockwise passing through the porous electrode 1210. The portion of the thermoelectric fluid or slurry 1207 that is between the porous electrode 1210 and the electrode 1208, is powered and generates a temperature differential across it, cooling its surface in contact with the rotating electrodes 1208 (in cooling mode). The fin sections 1209 therefore become cooler as they pass through the powered region, becoming coldest as they emerge at location C. Heat exchanging fluid enters at ambient temperature $T_A$ through inlet port 1202, passing by the fin sections 1209 in the clockwise direction and exits at temperature $T_c$ at outlet port 1203. As the cooled fins 1209 emerge from point C, they exchange heat with the heat exchanging fluid so that they and the electrodes 1208 to which they are attached return to substantially ambient temperature by the time they reach point A. The fluid or slurry thermoelectric material 1207 is also returned to room temperature because it is in contact with the electrode ring 1208 as it is pumped around. Advantageously, the heat exchange fluids are prevented from passing in a counterclockwise direction by blocking seals as in FIG. 2A. The rotation rate of the assembly, the thermal mass of the electrodes 1208 and fins 1209, and the current are chosen to achieve the desired performance.

The system 1200 also can function in the heating mode. Two sections, one heating and one cooling, can be mated in a manner similar to that of FIG. 6.

Other changes and combinations of thermoelectric systems wherein the temperature of individual elements, or fluid or slurry elements can be made by combining design features found in one or more of FIGS. 1 through 12 with those found in others. For example, fluid or slurry TE material as in FIG. 12 could be used in place of electrodes in the arrangement shown in FIG. 11 wherein the length could be adjusted by a porous piston shunting a portion of TE material contained in a cylindrical housing. As another example, the working fluid(s) flow direction(s) of FIGS. 8 and 10 can be reversed and power can be applied to the region(s) where flow is blocked and the insulative and conductive portions of the hub can be reversed so as to employ the benefits of resistance reduction to devices like that shown in FIG. 2.

The electrodes 1208 can be made from other materials that are good electrical and thermal conductors. Advantageously, the fins 1209 are thermally and electrically isolated from one another, but are themselves good thermal conductors.

Although several examples have been illustrated, the description is merely illustrative of the broad concepts of the inventions, which are set forth in the attached claims. In the claims, all terms are given their ordinary and customary meaning, and the description does not restrict the terms.

What is claimed is:

1. A thermoelectric system comprising:
   A plurality of thermoelectric elements forming at least one thermoelectric array with at least one first side and at least one second side exhibiting at least one temperature gradient between them during operation, the thermoelectric elements in thermal communication with a heat exchanger on at least the first or the second side, wherein at least a portion of the thermoelectric array is configured to be operated between at least first and second different current levels, wherein at least the first current level is below a current level that provides substantially maximal steady-state TE cooling or heating and wherein at least one thermoelectric element thermally couples to at least a first portion of material to or from which heat is to be transferred at a first point in time, and to at least a second portion of material to or from which heat is to be transferred at a second point in time.

2. The thermoelectric system of claim 1, wherein the operation between at least first and second current levels is substantially transient at each level.

3. The thermoelectric system of claim 2, wherein at least some of the thermoelectric elements exchange heat with at least one working fluid while such thermoelectric elements operate at the first current level.

4. The thermoelectric system of claim 3, wherein the first current level is zero.

5. The thermoelectric system of claim 2, wherein at least some of the thermoelectric elements exchange heat with at least one working fluid while such thermoelectric elements operate at said second level.

6. The thermoelectric system of claim 5, wherein the first current level is zero.

7. The thermoelectric system of claim 1, wherein the first current level is substantially below a current level that provides substantially maximum steady-state TE cooling or heating.

8. The thermoelectric system of claim 1, wherein the second current level is below, at or above a current level that provides substantially maximal steady-state TE cooling or heating.

9. The thermoelectric system of claim 1, wherein the current level is varied among at least said first and said second levels.

10. The thermoelectric system of claim 1, wherein the at least first and at least second levels are programmed levels.

11. The thermoelectric system of claim 1, wherein the at least first and at least second levels are variable levels, providing a cyclic pattern of current application.

12. The thermoelectric system of claim 1, wherein the at least first and second current levels are selected to provide improved efficiency over steady-state operation.

13. The thermoelectric system of claim 1, wherein the at least one thermoelectric array is configured to move such that at least some of the thermoelectric elements couple to at least one power source for a predefined period of time, and decouple from the at least one power source for a predefined period of time.

14. The thermoelectric system of claim 13, wherein at least some of the thermoelectric elements exchange heat with at least one working fluid while decoupled from the power.

15. The thermoelectric system of claim 14, wherein during the period that such thermoelectric elements are coupled to a power source, such thermoelectric elements do not exchange heat with the at least one working fluid.

16. The thermoelectric system of claim 13, wherein at least some of the thermoelectric elements exchange heat with at least one working fluid while coupled to the power.

17. The Thermoelectric system of claim 1, wherein the thermoelectric elements are further configured to adjust the resistance.

18. The thermoelectric system of claim 1, wherein the thermoelectric array in configured in a generally circular configuration, and is configured to rotate in a first direction about an axis of rotation, and where at least one working fluid travels along at least one heat exchanger in a direction opposite of the direction of rotation.

19. The thermoelectric system of claim 1, wherein the thermoelectric array in configured in a generally circular configuration, and is configured to rotate in a first direction about an axis of rotation, and where at least one working fluid travels along at least one heat exchanger in first direction.

20. The thermoelectric system of claim 1, wherein the system is used for cooling.

21. The thermoelectric system of claim 1, wherein the system is used for heating.

22. The thermoelectric system of claim 1, wherein the system is used for both cooling and heating.

23. A method of improving efficiency in a thermoelectric system having a plurality of thermoelectric elements forming at least one thermoelectric array having at least one first side and at least one second side exhibiting at least one temperature gradient between them during operation, the method comprising the steps of applying power to at least some of the thermoelectric elements in the at least one thermoelectric array in a non-steady state manner to operate the at least some of the thermoelectric elements between at least first and second different current levels, wherein at least the first current level is below a current level that provides substantially maximum steady-state TE cooling or heating;and thermally coupling at least one thermoelectric element to at least a first portion of material to or from which heat is to be transferred at a first point in time, and to at least a second portion of material to or from which heat is to be transferred at a second point in time.

24. The method of claim 23, wherein at least some of the thermoelectric elements exchange heat with at least one working fluid.

25. The method of claim 24, wherein at least a portion of the at last one working fluid is air.

26. The method of claim 24, wherein the thermoelectric array is used for heating.

27. The method of claim 24, wherein the thermoelectric array is used for both cooling and heating.

28. The thermoelectric system of claim 23, wherein at least some of the thermoelectric elements exchange heat with at least one working fluid while such thermoelectric elements operate at the first current level.

29. The thermoelectric system of claim 28, wherein the first current level is zero.

30. The thermoelectric system of claim 23, wherein at least some of the thermoelectric elements exchange heat with at least one working fluid while such thermoelectric elements operate at the second current level.

31. The thermoelectric system of claim 23, wherein the at least first and second current level are preprogrammed current levels.

32. The thermoelectric system of claim 23, wherein the first and second current levels are variable levels, providing a cyclic pattern of current application.

33. The thermoelectric system of claim 23, wherein the at least first and second current levels are selected to provide improved efficiency over steady-state operation of the thermoelectric system.

34. The method of claim 23, wherein the step of applying power to at least some of the thermoelectric elements comprises coupling the thermoelectric elements to a power source for a predefined period of time, and disconnecting said thermoelectric elements for a predefined period of time.

35. The method of claim 24, wherein at least some of the thermoelectric elements are configured to adjust the resistance during a predefined period of time.

36. The method of claim 23, wherein the first current level is substantially zero and the second current level is non-zero.

37. The method of claim 23, wherein the second current level is different from the first current level, said second current level below, at or above a current level that provides substantially maximum steady-state TE cooling or heating.

38. The method of claim 23, wherein the thermoelectric array is used for cooling.

* * * * *